US012753497B2

(12) United States Patent
Pierreux et al.

(10) Patent No.: US 12,753,497 B2
(45) Date of Patent: Oct. 6, 2026

(54) METHOD OF FORMING A LAYER BY ALD

(71) Applicant: ASM IP Holding B.V., Almere (NL)

(72) Inventors: Dieter Pierreux, Pepingen (BE); Quentin Nikitas Nicolas Lionel Eric Tricas, Schaerbeek (BE); Werner Knaepen, Leuven (BE); Alessandro Viva, Leuven (BE)

(73) Assignee: ASM IP Holding B.V., Almere (NL)

(*) Notice: Subject to any disclaimer, the term of this patent is extended or adjusted under 35 U.S.C. 154(b) by 0 days.

(21) Appl. No.: 18/748,983

(22) Filed: Jun. 20, 2024

(65) Prior Publication Data

US 2024/0425984 A1 Dec. 26, 2024

Related U.S. Application Data

(60) Provisional application No. 63/509,636, filed on Jun. 22, 2023.

(51) Int. Cl.

| | |
|---|---|
| ***C23C 16/455*** | (2006.01) |
| ***C23C 16/44*** | (2006.01) |
| ***C23C 16/52*** | (2006.01) |

(52) U.S. Cl.

CPC .... *C23C 16/45529* (2013.01); *C23C 16/4408* (2013.01); *C23C 16/45553* (2013.01); *C23C 16/52* (2013.01)

(58) Field of Classification Search

None

See application file for complete search history.

(56) References Cited

U.S. PATENT DOCUMENTS

| | | | | |
|---|---|---|---|---|
| 8,507,038 | B2 | 8/2013 | Waechtler | |
| 9,748,125 | B2 * | 8/2017 | Wu | C23C 16/4584 |
| 2010/0003406 | A1 * | 1/2010 | Lam | C23C 16/45536 427/255.391 |
| 2020/0043721 | A1 | 2/2020 | Liou | |
| 2020/0318236 | A1 * | 10/2020 | Arkles | C23C 16/16 |
| 2022/0119944 | A1 * | 4/2022 | Yoshimoto | H01L 21/67248 |
| 2022/0356566 | A1 * | 11/2022 | Nakamura | C23C 16/04 |
| 2024/0158913 | A1 * | 5/2024 | Chandrashekar | H01L 21/76876 |

* cited by examiner

*Primary Examiner* — Mandy C Louie

(74) *Attorney, Agent, or Firm* — Banner & Witcoff, Ltd.

(57) ABSTRACT

A method of forming a layer of a material on one or more substrates by ALD is disclosed. Embodiments of the presently described method comprise performing a plurality of deposition cycles comprising at least two precursors pulses with intervening purge pulses to form the layer of the material on the one or more substrates. During each deposition cycle, a ratio of the process chamber pressure during each precursor pulse of the at least two precursor pulses to the process chamber pressure during an intervening purge pulse is equal or different from one another.

24 Claims, 2 Drawing Sheets

METHOD OF FORMING A LAYER BY ALD

CROSS-REFERENCE TO RELATED APPLICATION(S)

Figure 1A:
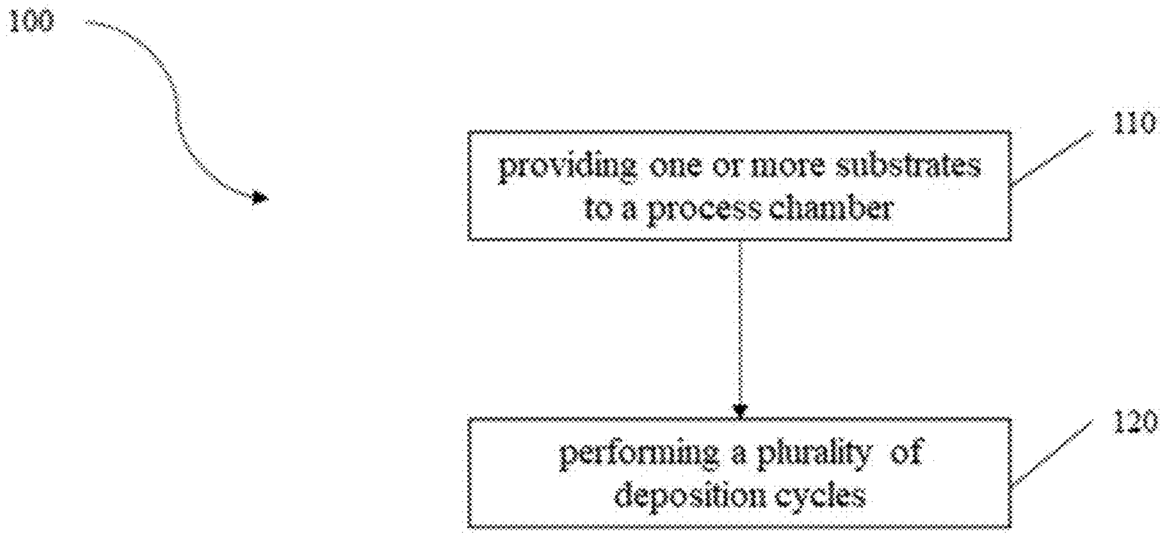

This application claims the benefit of U.S. Provisional Application 63/509,636 filed on Jun. 22, 2023, the entire contents of which are incorporated herein by reference.

FIELD OF INVENTION

The present disclosure relates to semiconductor processing. More specifically, it relates to a method of forming a layer on a substrate by atomic layer deposition (ALD) and to a substrate processing system comprising an ALD apparatus for forming the layer.

BACKGROUND OF THE DISCLOSURE

Material deposition for forming layers on substrates continue to be among the important process steps in the manufacturing of semiconductor devices. Atomic layer deposition, in particular, provides the advantage forming conformal layers that may also allow for controlled tuning of the layer thickness.

One of the challenges associated with ALD may relate to growth per cycle as this may also have an influence on the throughput of the deposition process. This may have a negative impact on the cycle time as well as on the operational cost for manufacturing.

Furthermore, with the use of apparatuses tailored for batch processing, whereby a plurality of substrates can be processed at a time, a forthcoming challenge associated with ALD may relate to thickness uniformity. Lack of thickness uniformity in a deposition process may pose further challenges that may be associated with subsequent processing that needs to take place in semiconductor manufacturing.

There may, therefore, be a need for improving the ALD process.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It may be an object of the present disclosure to improve the ALD process. More specifically, it may be an object to provide optimized growth rate per cycle and optimized throughput, improved thickness uniformity and improved electrical properties of layers formed by ALD. It may further be an object to provide layers formed by ALD having reduced contamination levels. To at least partially achieve these objects, the present disclosure may provide a method for forming a layer on one or more substrates by ALD and a substrate processing system comprising an ALD apparatus for forming the layer as defined in independent claims. Further embodiments are provided in the dependent claims.

In a first aspect, the present disclosure relates to a method of forming a layer of a material on one or more substrates by atomic layer deposition (ALD). The method may comprise providing the one or more substrates in a process chamber. The method may further comprise performing a plurality of deposition cycles, thereby forming the layer of the material on the one or more substrates. Each deposition cycle may comprise at least two precursor pulses with intervening purge pulses. The process chamber pressure during each deposition cycle may be in a range from about 0.1 Torr to about 10 Torr. During each deposition cycle, a ratio of the process chamber pressure during each precursor pulse of the at least two precursor pulses to the process chamber pressure during an intervening purge pulse may be equal or different from one another.

The method according to embodiments of the first aspect of the present disclosure may allow for forming a layer of a material on one or more substrates by ALD. Particularly, the method according to embodiments of the first aspect of the present disclosure may allow for forming a layer of a material on a plurality of substrates by ALD.

It may be an advantage of embodiments of the first aspect that an increased growth rate of the layer may be obtained. Increased growth rate may further allow for improving the throughput the deposition process.

It may further be an advantage of embodiments of the first aspect that wafer within non-uniformity (WIWNU) the substrate may be reduced. This may further be advantageous when forming the layer on a plurality of substrates. This may allow for improving uniform thickness of the layer across the surface of the substrate on which the layer deposition is carried out. This may advantageously help to improve the yield for the subsequent processes in the semiconductor manufacturing such as for example, further layer depositions, lithography and etch.

It may further be an advantage of embodiments of the first aspect that reliability of the semiconductor devices made comprising the layer formed by the ALD process may be improved thanks to the improved thickness uniformity.

It may also be an advantage of embodiments of the first aspect that contamination level in the layer may be reduced. This may advantageously relate to a reduction in, such as for example, carbon contamination or hydrogen contamination.

It may further be an advantage of embodiments of the first aspect that electrical properties of the semiconductor devices made comprising the layer formed by the ALD process may be improved thanks to the reduced contamination.

In a second aspect, the present disclosure relates to a substrate processing system. The substrate processing system may comprise an atomic layer deposition (ALD) apparatus. The ALD apparatus may comprise a controller (1080) that may be configured to execute instructions stored in a non-transitory computer readable medium and to cause the ALD apparatus to form the layer of the material on the one or more substrates in accordance with a method according to embodiments of the first aspect of the present disclosure.

The substrate processing system according to embodiments of the second aspect of the present disclosure may allow for an increased throughput for the deposition process. This may help to decrease cycle time of the deposition process. In semiconductor industry, this may reflect as a decrease in the cycle time of chip production.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure Like reference numbers will be used for like elements in the drawings unless stated otherwise. Reference signs in the claims shall not be understood as limiting the scope.

FIG. 1*a*: Flowchart of an exemplary method according to embodiments of the first aspect of the present disclosure.

Figure 1B:
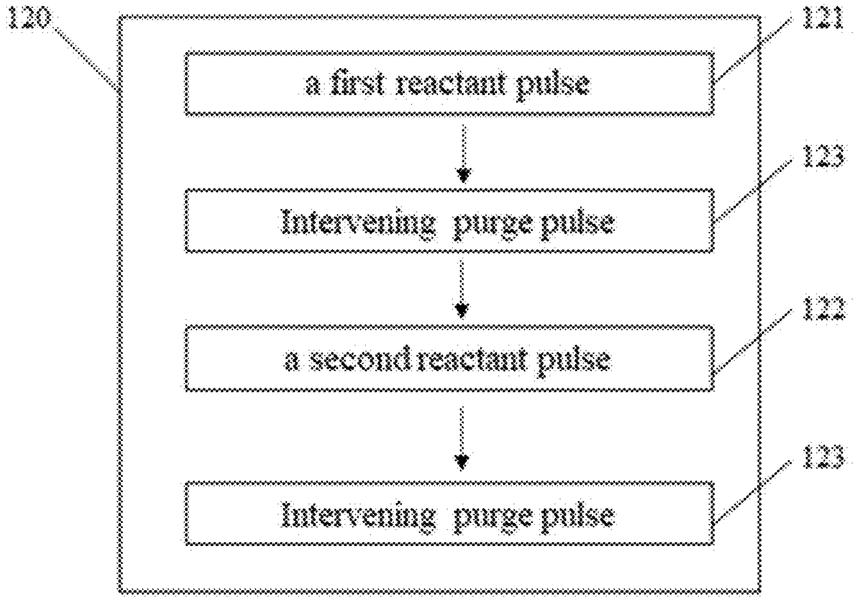

FIG. 1*b*: Flowchart of an embodiment according to the first aspect of the present disclosure.

Figure 2:
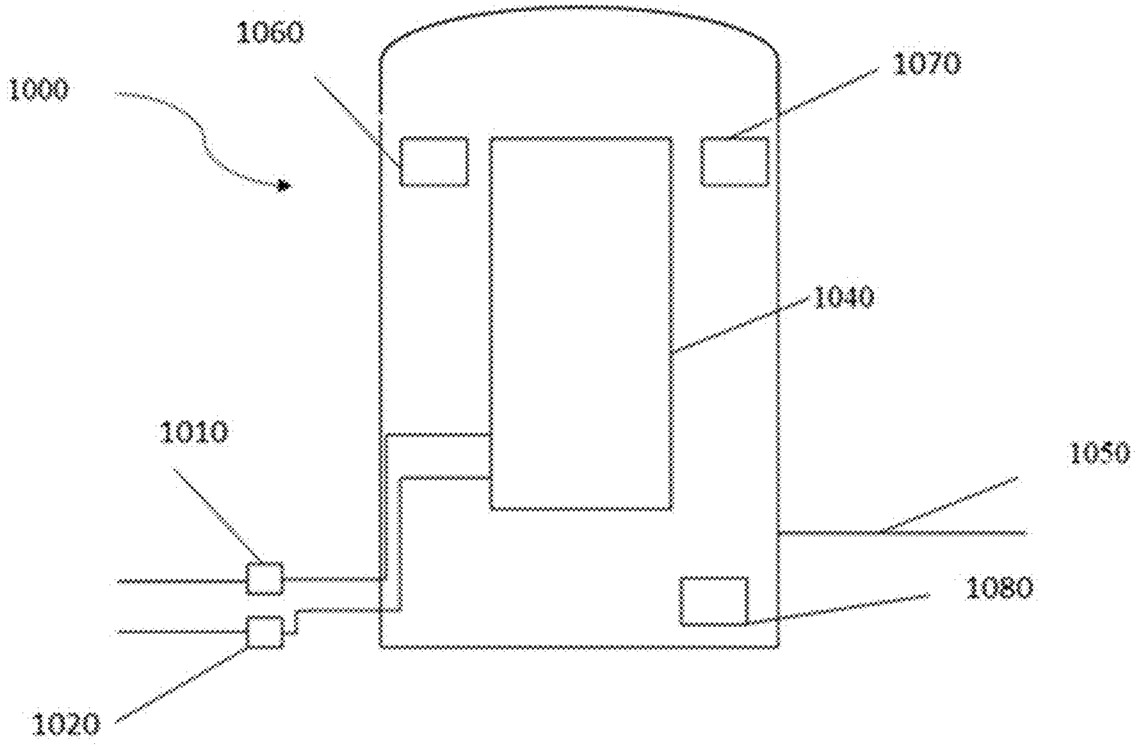

FIG. 2: A schematic view of an ALD apparatus comprised in a substrate processing system according to embodiments of the second aspect of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub-combinations of the various processes, systems, and configurations, and other features, functions, acts, and/or properties disclosed herein, as well as any and all equivalents thereof.

It is to be noticed that the term "comprising", as used herein, should not be interpreted as being restricted to the means listed thereafter. It does not exclude other elements or steps. It is thus, to be interpreted as specifying the presence of the stated features, steps or components as referred to. However, it does not prevent one or more other steps, components, or features, or groups thereof from being present or being added.

Reference throughout the specification to "embodiments" in various places are not necessarily all referring to the same embodiment, but may. Furthermore, the particular features, structures or characteristics maybe combined in any suitable manner, as would be apparent to one of the ordinary skill in the art from the disclosure, in one or more embodiments.

Reference throughout the specification to "some embodiments" means that a particular structure, feature step described in connection with these embodiments is included in some of the embodiments of the present invention. Thus, phrases appearing such as "in some embodiments" in different places throughout the specification are not necessarily referring to the same collection of embodiments, but may.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may.

It is to be noticed that the term "comprise substantially" used in the claims refers that further components than those specifically mentioned can, but not necessarily have to, be present, namely those not materially affecting the essential characteristics of the material, compound, or composition referred to.

The terms first, second, third, and the like in the description and in the claims, are used for distinguishing between similar elements. They are not necessarily used for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

The following terms are provided only to help in the understanding of the disclosure.

As used herein and unless provided otherwise, the term "intervening purge pulses" may refer to the provision of an inert gas in between precursor pulses. Intervening purge pulses may also be referred to as "intervening evacuation pulses" such that the precursors provided to the process chamber do not come into contact with each other in the gas phase.

As used herein and unless provided otherwise, the term "reducing WIWNU" may refer to the reduction in the variation of the thickness of the layer across the surface of the substrate such as for example, from center to edge of the substrate.

The disclosure will now be described by a detailed description of several embodiments of the disclosure. It is clear that other embodiments of the disclosure can be configured according to the knowledge of persons skilled in the art in the absence of departure from the technical teaching of the disclosure. The disclosure is limited only by the terms of the claims included herein.

FIG. 1*a* and FIG. 1*b* show a flowchart of an exemplary method according to embodiments of the first aspect of the present disclosure.

Described herein is a method (100) forming a layer of a material on one or more substrates by ALD.

The method (100) may comprise providing (110) the one or more substrates in a process chamber.

In some embodiments, the one or more substrates may be provided to the process chamber together.

Thus, in some embodiments, the one or more substrates may be a plurality of substrates. The plurality of substrates may be arranged in a substrate carrier extending in a longitudinal direction. The substrate carrier may be receivable in the process chamber. The longitudinal direction may, in some embodiments, be a horizontal direction. The longitudinal direction may, in some embodiments, be a vertical direction.

Therefore, in some embodiments, the process chamber may be comprised in a semiconductor apparatus extending in the vertical direction with respect to the ground, on which the apparatus is stationed. In some embodiments, the semiconductor apparatus may be a vertical furnace. This may provide the advantage of performing each of the ALD deposition cycles within a duration of the order of minutes so that switching between pulses may be carried out slower compared to ALD deposition cycles lasting shorter.

In some embodiments, the one or more substrates may be provided to the process chamber one at a time, whereby the one or more substrates may be arranged on a substrate support constructed and arranged to hold a single substrate. The process chamber may thus, be one of at least two process chambers comprised in the semiconductor processing apparatus.

In some embodiments, the process chamber may be a single process chamber comprised in the semiconductor processing apparatus.

The method (100) may further comprise performing (120) a plurality of deposition cycles, thereby forming the layer of the material on the one or more substrates. Each deposition cycle may comprise at least two precursor pulses (121, 122) with intervening purge pulses (123).

Each of the at least two precursor pulses may comprise providing a precursor gas. Each of the precursor gases may be provided in the presence of a carrier gas. In embodiments, the carrier gas may comprise $N_2$, and noble gases such as for example, Ar, Ne, He, Xe and Kr.

In some embodiments, the carrier gas may comprise substantially $N_2$, Ar, He, Ne, Xe, Kr or combinations thereof.

In embodiments, each of the at least two precursor pulses may be different from one another.

Intervening purge pulses may be provided in between the at least two precursor pulses (121, 122) in each deposition cycle (120) and after the precursor pulse before completing each deposition cycle (120) as schematically represented in FIG. 1*b*. Intervening purge pulses may comprise providing an inert gas to the process chamber in between the precursor pulses.

In some embodiments, each of the intervening purge pulses (123) may be provided to the process chamber in substantially the same manner, such as for example, providing the same inert gas, with the same flow rate, at the same process chamber temperature and at the same process chamber pressure.

In some embodiments, each of the intervening purge pulses (123) may be provided to the process chamber different from one another. The duration of each of the intervening purge pulses may, for example, be different from one another depending on which precursor gas needs to be purged. In that respect, intervening purge pulse carried out after the provision of an oxygen containing precursor gas, such as for example $H_2O$, may be longer than the provision of the precursor gas of the material.

A process chamber pressure during each deposition cycle may be in a range from about 0.1 Torr to about 10 Torr. During each deposition cycle, a ratio of the process chamber pressure during each precursor pulse to the process chamber pressure during an intervening purge pulse may be equal or different from one another.

Thus, in some embodiments, a variation in process chamber pressure within each deposition cycle, particularly between that of each precursor pulse to the intervening purge pulse may be the same.

In another exemplary embodiment, the formation of the layer may be carried out using two precursor pulses, being different from one another, separated by intervening purge pulses. The process chamber pressure during the intervening purge pulses may be set to 0.1 Torr. The process chamber pressure during both the first precursor pulse and the second precursor pulse may be set to a pressure value in a range of 1.5 Torr to 5 Torr.

In embodiments, the process chamber pressure during both the first precursor pulse and the second precursor pulse may be set to a pressure value in a range of from at least 1.5 Torr to at most 2 Torr, or from at least 2 Torr to at most 2.5 Torr, or from at least 2.5 Torr to at most 3 Torr, or from at least 3 Torr to at most 3.5 Torr, or from at least 3.5 Torr to at most 4 Torr, or from at least 4 Torr to at most 4.5 Torr, or from at least 4.5 Torr to at most 5 Torr.

In some embodiments, the variation in process chamber pressure within each deposition cycle, particularly between that of each precursor pulse to the intervening purge pulse may be different from one another.

In an exemplary embodiment, the formation of the layer may be carried out using two precursor pulses, being different from one another, separated by intervening purge pulses. The process chamber pressure during the intervening purge pulses may be set to 0.1 Torr. The process chamber pressure during the first precursor pulse may be set to 1 Torr and during the second precursor pulse may be set to 10 Torr.

In embodiments, the process chamber pressure during each of the at least two precursor pulses and during each of the intervening purge pulses may be chosen such that the variation in process chamber pressure when going from a precursor pulse to a subsequent intervening purge pulse creates a process chamber pressure swing of such as for example, at least 5 times. This may be advantageous in facilitating the nucleation of the layer that may be achieved at a higher process chamber pressure during the provision of the precursor pulses compared to the process chamber pressure during the intervening purge pulses.

Without wishing to be bound by theory, it may be stated that performing film formation by ALD at lower process pressure values, such as for example, lower than 1 Torr may lead to a reduced growth per cycle, which may then lead to a reduced throughput for the process. Furthermore, differences in saturation level between the edge and center of the substrate may lead to poor WIWNU. This may for example be experienced when $O_3$ is used as the oxygen containing precursor gas. On the other hand, performing film formation by ALD at higher process pressure values, such as for example, higher than 1 Torr may help to improve the growth per cycle, thereby increasing the throughput of the process. Furthermore, higher saturation levels obtained between the edge and the center of the substrate may lead to a reduction in the thickness variation of the layer formed, thereby improving the WIWNU. This may for example be experienced when $O_3$ is used as the oxygen containing precursor gas. However, performing film formation by ALD at higher process pressure values may lead to particle formation. It may further require increased purge times.

Therefore, performing film formation by ALD by implementing pressure swings when going from a precursor pulse to a subsequent intervening purge pulse may allow for increasing the growth rate per cycle (GPC) of the layer deposited. The increased growth rate may for example, be above 1 A° per cycle. This may in turn lead to an increase in throughput of the deposition process. It may further provide the advantage of reducing WIWNU of each of the substrate. This may consequently allow for achieving a uniform thickness of the layer across the surface of the substrate on which the layer deposition is carried out.

In embodiments, the atomic layer deposition may be performed at a temperature of less than 700 °C. This may allow for the possibility of forming the layer with an improved growth rate per cycle.

In some embodiments, the atomic layer deposition may be performed at a temperature in a range of 20 °C to 700 °C. This process window may allow for performing the formation of the layer at a lower process temperature as well as at a higher process temperature, whereby improved growth rate per cycle can be achievable.

In some embodiments, the atomic layer deposition may be performed at a temperature in a range of from at least 20 °C to at most 100 °C, or from at least 100 °C to at most 200 °C, or from at least 200 °C to at most 300 °C, or from at least 300 °C to at most 400 °C, or from at least 400 °C to at most 500 °C, or from at least 500 °C to at most 600 °C, or from at least 600 °C to at most 700 °C.

In embodiments, a first ratio of the process chamber pressure during a first precursor pulse of the at least two precursor pulses to the process chamber pressure during the intervening purge pulse may be lower than a second ratio of the process chamber pressure during a second precursor pulse of the at least two precursor pulses to the process chamber pressure during the intervening purge pulse.

This may further allow for enhancing the variation in the process chamber pressure within each deposition cycle. This may thus, further contribute to the increase in GPC of the layer deposited.

In embodiments, the process chamber pressure may be the same during the intervening purge pulses and it may be lower than the process chamber pressure during the first precursor pulse and during the second precursor pulse. This helps to create the pressure swing in the process chamber when going from a precursor pulse to a subsequent intervening purge pulse within the deposition cycle. Furthermore, the process chamber pressure during the second precursor pulse may be higher than the process chamber pressure during the first precursor pulse. A higher variation in process chamber pressure may be created in this way when purging after the provision of the second precursor pulse compared to after the provision of the first precursor pulse.

In embodiments, the first precursor pulse may be different than the second precursor pulse.

In embodiments, the variation in the process chamber pressure between the first precursor pulse and the second precursor pulse may be configured so as to improve the growth rate per cycle.

Thus, in some embodiments, the process chamber pressure during the second precursor pulse is at least two times higher than the process chamber pressure during the first precursor pulse.

In some embodiments, the process chamber pressure during the second precursor pulse is at least five times higher than the process chamber pressure during the first precursor pulse.

In some embodiments, the process chamber pressure during the second precursor pulse is at least ten times higher than the process chamber pressure during the first precursor pulse.

The higher process chamber pressure during the second precursor pulse compared to that during the first precursor pulse may help to improve uniformity of the layer thickness across the surface of the substrate. It may also be advantageous in reducing decomposition of the precursor. Furthermore, particle formation may be reduced. During ALD process, layer formation may also occur on inner surfaces of the process chamber. Flaking or breaking of this layer may lead to particle formation.

In embodiments, the first precursor pulse may comprise providing a precursor gas of the material and the second precursor pulse may comprise providing an oxygen containing precursor gas or providing a nitrogen containing precursor gas.

Provision of the first precursor may result in chemisorption of the surface of the substrate, on which layer formation is taking place, such that a monolayer of the first precursor covers the surface of the substrate. Provision of the oxygen containing precursor gas may then lead to the formation of an oxide layer, while the provision of the nitrogen containing precursor gas may lead to the formation of a nitride layer.

In embodiments, the precursor gas of the material may be obtained from a liquid source precursor or a solid source precursor. Therefore, one of the at least two precursor storage modules and the respective connections from said precursor storage module to the process chamber (1040) may be constructed and arranged to create and to transfer the precursor gas of the material.

In embodiments, the precursor gas of the material may be a metal organic precursor.

In some embodiments, the precursor gas of the material may comprise a transition metal. In some embodiments, the precursor gas of the material may comprise a vapor of a transition metal chloride. The vapor of the transition metal chloride may be provided to the process chamber with the help of a carrier gas. In some embodiments, the precursor gas of the material may comprise substantially the vapor of the transition metal chloride.

In some embodiments, the precursor gas of the material may comprise a vapor of $HfCl_4$, $TaCl_5$, $TiCl_4$, $MoCl_5$, $ZrCl_4$, $MoO_2Cl_2$, or $VCl_4$.

In some embodiments, the precursor gas of the material may comprise a Group III element or a Group IV element.

In embodiments, the precursor gas of the material may comprise $Al(CH_3)_3$ or $AlCl_3$. Depending on the second precursor pulse, being the oxygen containing precursor gas or the nitrogen containing precursor gas, an aluminum nitride or an aluminum oxide layer may be formed.

In embodiments, the precursor gas of the material may comprise a Si-containing gas. Depending on the second precursor pulse, being the oxygen containing precursor gas or the nitrogen containing precursor gas, a silicon nitride or a silicon oxide layer may be formed.

In embodiments, the Si-containing gas may be metal organic silicon precursor.

In embodiments, the Si-containing gas may be a silicon halide. This may lead to the formation of a silicon-comprising layer by ALD. The silicon halide may be represented by the formula $Si_nX_{2n+2}$, where X is halogen and where n is an integer from at least 1 to 5.

In some embodiments, the precursor gas of the material may comprise octa-chloro-tri-silane, hexa-chloro-di-silane or silicon tetrachloride. In other words, the silicon halide may be octa-chloro-tri-silane, hexa-chloro-di-silane or silicon tetrachloride.

In embodiments, the process chamber pressure of the precursor gas of the material may be in a range from about 0.1 Torr to about 5.0 Torr.

In embodiments, the process chamber pressure of the precursor gas of the material may be in a range from at least about 0.1 Torr to at most about 0.5 Torr or from at least about 0.5 Torr to at most about 1.0 Torr or from at least about 1 Torr to at most about 1.5 Torr or from at least about 1.5 Torr to at most about 2.0 Torr or from at least about 2.0 Torr to at most about 2.5 Torr or from at least about 2.5 Torr to at most about 3.0 Torr or from at least about 3.0 Torr to at most about 3.5 Torr or from at least about 3.5 Torr to at most about 4.0 Torr or from at least about 4.0 Torr to at most about 4.5 Torr or from at least about 4.5 Torr to at most about 5.0 Torr.

In some embodiments, the process chamber pressure of the precursor gas of the material may be in a range from about 0.2 Torr to about 0.5 Torr.

In embodiments, the process chamber pressure of each of the intervening purge pulses may be in a range from about 0.1 Torr to about 1.0 Torr.

In embodiments, the process chamber pressure of each of the intervening purge pulses may be in a range from at least about 0.1 Torr to at most about 0.2 Torr or from at least about 0.2 Torr to at most about 0.3 Torr or from at least about 0.3 Torr to at most about 0.4 Torr or from at least about 0.4 Torr to at most about 0.5 Torr or from at least about 0.5 Torr to at most about 0.6 Torr or from at least about 0.6 Torr to at most about 0.7 Torr or from at least about 0.7 Torr to at most about 0.8 Torr or from at least about 0.8 Torr to at most about 0.9 Torr or from at least about 0.9 Torr to at most about 1.0 Torr.

In embodiments, at least one of the first precursor pulse and the second precursor pulse may last from 1 seconds to 5 minutes.

In some embodiments, at least one of the first precursor pulse and the second precursor pulse may last from 2 seconds to 5 seconds.

In some embodiments, each deposition cycle may comprise three precursor pulses. This may be advantageous in enabling the formation of a layer comprising a ternary compound, a doped layer, a nitride layer, a doped nitride layer, an oxide layer, a doped oxide layer, a carbide layer or a doped carbide layer. Thus, in these embodiments, at least one of the three precursor pulses may comprise providing the precursor gas of the material. Depending on the layer to be formed, the remaining precursors to be provided may be chosen from the oxygen containing precursor gas, the nitrogen containing precursor gas, a gas comprising a dopant or combinations thereof.

In some embodiments, the process chamber pressure may be the same during the intervening purge pulses and it may be lower than the process chamber pressure during any one of the three precursor pulses. This helps to create the pressure swing in the process chamber when going from a precursor pulse to a subsequent intervening purge pulse within the deposition cycle.

In some embodiments, each of the intervening purge pulses (123) may be provided to the process chamber in substantially the same manner, such as for example, providing the same inert gas, with the same flow rate, at the same process chamber temperature and at the same process chamber pressure.

In some embodiments, each of the intervening purge pulses (123) may be provided to the process chamber different from one another. The duration of each of the intervening purge pulses may, for example, be different from one another depending on which precursor gas needs to be purged. In that respect, intervening purge pulse carried out after the provision of an oxygen containing precursor gas, such as for example $H_2O$, may be longer than the provision of any one of the three precursor pulses.

In some embodiments, the process chamber pressure during any one of the precursor pulses may be higher than the process chamber pressure during any one of the remaining precursor pulses, thereby helping further to the creation of the pressure swing, whereby process chamber pressure during the remaining precursor pulses may be the same with one another or different from one another.

In some embodiments, the process chamber pressure during the three precursor pulses may be the same.

In an exemplary embodiment, the first precursor pulse may comprise providing octa-chloro-tri-silane ($Si_3Cl_8$-OCTS) as the precursor gas of the material. The second precursor pulse may comprise $NH_3$ as the nitrogen containing precursor gas. A third precursor pulse may be present that may comprise providing an organoborane, such as for example, triethyl borane ($(CH_3CH_2)_3B$-TEB). Each of the three precursor pulses may be followed by the intervening purge pulses in each deposition cycle.

In some embodiments, each deposition cycle may comprise four precursor pulses. This may be advantageous in enabling the formation of a layer comprising a quaternary compound.

In embodiments, at least one of the four precursor pulses may comprise providing the precursor gas of the material. Depending on the layer to be formed, the remaining precursors to be provided may be chosen from the oxygen containing precursor gas, the nitrogen containing precursor gas, a gas comprising a dopant or combinations thereof.

In some embodiments, the process chamber pressure may be the same during the intervening purge pulses and it may be lower than the process chamber pressure during any one of the four precursor pulses. This helps to create the pressure swing in the process chamber when going from a precursor pulse to a subsequent intervening purge pulse within the deposition cycle.

In some embodiments, each of the intervening purge pulses (123) may be provided to the process chamber in substantially the same manner, such as for example, providing the same inert gas, with the same flow rate, at the same process chamber temperature and at the same process chamber pressure.

In some embodiments, each of the intervening purge pulses (123) may be provided to the process chamber different from one another. The duration of each of the intervening purge pulses may, for example, be different from one another depending on which precursor gas needs to be purged. In that respect, intervening purge pulse carried out after the provision of an oxygen containing precursor gas, such as for example $H_2O$, may be longer than the provision of any one of the four precursor pulses.

In some embodiments, the process chamber pressure during any one of the precursor pulses may be higher than the process chamber pressure during any one of the remaining precursor pulses, thereby helping further to the creation of the pressure swing, whereby process chamber pressure during the remaining precursor pulses may be the same with one another or different from one another.

In some embodiments, the process chamber pressure during the four precursor pulses may be the same.

In embodiments, the method may further comprise performing a thermal treatment process after performing the plurality of deposition cycles. The thermal treatment process may be at least one of an in-situ and an ex-situ thermal treatment process. Depending the ambient, the temperature, the pressure of the thermal treatment process, it may advantageously allow for reducing contamination in the layer.

The thermal treatment process may be performed under an ambient that may comprise at least one of $O_3$, $O_2$, $H_2O$ and $N_2$. This thermal treatment process may help in reducing the contamination in the ALD layer, such as for example, carbon contamination or hydrogen contamination.

In some embodiments, the thermal treatment process may be performed after forming the desired ALD layer thickness. Thus, the method (100) may further comprise performing the thermal treatment after performing the plurality of deposition cycles aiding to get the desired thickness. In other words, the thermal treatment process may be performed after upon completion of the formation of the ALD layer with the desired thickness.

In some embodiments, the method (100) may further comprise repeating the performing of the plurality of deposition cycles and the performing of the at least one of an in-situ and an ex-situ thermal treatment process. This may be advantageous in completing the formation of the desired ALD layer not only incrementally but also helping to subsequently remove the contamination in each incremental layer.

In embodiments, the atomic layer deposition may be performed at a temperature in a range of 200 °C to 450 °C and the precursor gas of the material may comprise trimethylaluminum (TMA) that is denoted as $Al(CH_3)_3$. The deposition cycle may further comprise the oxygen containing precursor gas, thereby forming an aluminum oxide layer. The oxygen containing gas may, in embodiments, be $O_3$, $H_2O$, $O_2$, $H_2O_2$, $N_2O$ or combinations thereof. When a combination is used, the flow of the different oxygen containing gases may be performed sequentially, in other words, flow of one type of oxygen containing gas following a flow of the other type of the oxygen containing gas. This may provide the advantage of forming the aluminum oxide layer at a lower process temperature, whereby improved growth rate for cycle may be achieved.

In an exemplary embodiment, a combination of $H_2O$ and $O_3$ may be used.

This may further be advantageous in obtaining the aluminum oxide layer with reduced WIWNU across the substrate. Reduced WIWNU may result from the pressure swing of the process chamber when going from a precursor pulse at a higher process chamber pressure to a subsequent intervening purge pulse at a lower process chamber pressure. Particularly, reduced WIWNU may result from having the process chamber pressure during the oxygen containing precursor pulse higher than the process chamber pressure during the TMA precursor pulse.

In embodiments, the atomic layer deposition may be performed at a temperature in a range of from at least 200 °C to at most 250 °C or from at least 250 °C to at most 300 °C or from at least 300 °C to at most 350 °C or from at least 350 °C to at most 400 °C or from at least 400 °C to at most 450 °C.

In embodiments, the thermal treatment process may be an in-situ thermal treatment process, an ex-situ thermal treatment process or a combination of both.

Thus, in some embodiments, the thermal treatment process may be performed in-situ at a temperature in a range of 450 °C to 1000 °C. The process chamber pressure in these embodiments may be in a range of 0.1 Torr to 10 Torr for a duration of in a range of 15 minutes to 5 hours. The in-situ thermal treatment process may be performed under an ambient comprising $O_3$, $O_2$, $H_2O$ and $N_2$.

The temperature may, in embodiments be from at least 450 °C to at most 550 °C or from at least 550 °C to at most 650 °C or from at least 650 °C to at most 750 °C or from at least 750 °C to at most 850 °C or from at least 850 °C to at most 1000 °C.

In some embodiments, the thermal treatment process may be performed ex-situ at a temperature of about 1000 °C. This ex-situ thermal treatment may be performed for a duration in a range of 1 minute to 5 minutes. The ex-situ thermal treatment process may be performed under an ambient comprising $N_2$ and $O_2$.

In an exemplary embodiment, the aluminum oxide layer may be formed by ALD at a process temperature of 200 °C using TMA as the precursor gas and a combination of $O_3$ and $H_2O$ as the oxygen containing precursor gas in each deposition cycle of the plurality of deposition cycles. Following the desired layer formation, the in-situ thermal treatment as disclosed herein may be performed at a temperature of about 600 °C under the ambient comprising $O_3$, $O_2$, $H_2O$ and $N_2$.

Further described herein is a substrate processing system comprising an atomic layer deposition apparatus. FIG. 2 shows schematically an ALD apparatus that may be comprised in the substrate processing system.

The ALD apparatus (1000) may comprise a process chamber (1040) that may be configured to form a layer on one or more substrates. The apparatus (1000) may further comprise a heater (1060) that may be configured for heating and maintaining process temperature in the process chamber (1040). Process temperature may be measured using thermocouples that are positioned inside the process chamber. Thermocouples may be placed at different zones along the longitudinal axis, thereby allowing to obtain multi-zone temperature measurement.

The apparatus (1000) may further comprise a pressure controller (1070) that may be configured for attaining and maintaining process pressure in the process chamber (1040). Process pressure may be measured by using a pressure transducer. At least two precursor storage modules (1010, 1020) may further be comprised in the apparatus (1000). The precursors stored in each of the at least two precursor storage modules may be different from one another. One of the at least two precursor storage modules (1010) may be constructed and arranged to hold a precursor gas of the material, while the other precursor storage module (1020) may be constructed and arranged to hold an oxygen containing precursor gas or a nitrogen containing precursor gas. The apparatus (1000) may further comprise a controller that may be configured to execute instructions stored in a non-transitory computer readable medium and to cause the atomic layer deposition apparatus to form the layer of the material on the one or more substrates in accordance with embodiments of the method according to the first aspect of the present disclosure.

In embodiments, the precursor gas of the material may be obtained from a liquid source precursor or a solid source precursor. Therefore, one of the at least two precursor storage modules may be constructed and arranged to at least create and to hold the precursor gas of the material. The respective connections from said precursor storage module to the process chamber (1040) may be constructed and arranged to transfer the precursor gas of the material to the process chamber (1040).

The apparatus (1000) may further comprise an exhaust gas outlet (1050). The exhaust gas outlet (1050) may be constructed and arranged to remove a portion of the at least two precursor gases from the process chamber (1040). The portion of the at least two precursor gases to be removed from the process chamber (1040) may be further monolayers that may form by physisorption on the substrate.

In embodiments, the ALD apparatus (1000) may be a vertical furnace batch ALD apparatus. A plurality of substrates may be receivable in the process chamber (1040) arranged in a substrate boat.

The apparatus (1000) may further comprise a gas injector (not shown in the figures) constructed and arranged to provide the at least two precursor gases and the intervening purge gas to the process chamber (1040). The gas injector may, in embodiments, be a multi hole gas injector.

The embodiments of the present disclosure do not limit the scope of invention as these embodiments are defined by the claims appended herein and their legal equivalents. Any equivalent embodiments are intended to be within the scope of this invention. Modifications of the disclosure that are different from one another, in addition to those disclosed herein, may become apparent to those skilled in the art. Such modifications and the embodiments originating therefrom, are also intended to fall within the scope of the claims appended herein.

The invention claimed is:

1. A method of forming a layer of a material on one or more substrates by atomic layer deposition, the method comprising:

providing the one or more substrates in a process chamber, and performing a plurality of deposition cycles, thereby forming the layer of the material on the one or more substrates, wherein each deposition cycle comprises at least two precursor pulses with intervening purge pulses, wherein a process chamber pressure during each deposition cycle is in a range from about 0.1 Torr to about 10 Torr and wherein, during each deposition cycle, a first ratio of the process chamber pressure during a first precursor pulse of the at least two precursor pulses to the process chamber pressure during a first intervening purge pulse is lower than a second ratio of the process chamber pressure during a second precursor pulse of the at least two precursor pulses to the process chamber pressure during a second intervening purge pulse.

2. The method according to claim 1, wherein the process chamber pressure is the same during the first intervening purge pulse and the second intervening purge pulse and is lower than the process chamber pressure during the first precursor pulse and during the second precursor pulse and wherein the process chamber pressure during the second precursor pulse is higher than the process chamber pressure during the first precursor pulse.

3. The method according to claim 1, wherein the process chamber pressure during the second precursor pulse is at least two times higher than the process chamber pressure during the first precursor pulse.

4. The method according to claim 3, wherein the process chamber pressure during the second precursor pulse is at least five times higher than the process chamber pressure during the first precursor pulse.

5. The method according to claim 4, wherein the process chamber pressure during the second precursor pulse is at least ten times higher than the process chamber pressure during the first precursor pulse.

6. The method according to claim 1, wherein the first precursor pulse comprises providing a precursor gas of the material and the second precursor pulse comprises providing an oxygen containing precursor gas or providing a nitrogen containing precursor gas.

7. The method according to claim 1, wherein the process chamber pressure of a precursor gas of the material is in a range from about 0.1 Torr to about 5.0 Torr.

8. The method according to claim 1, wherein the process chamber pressure of the first intervening purge pulse and the second intervening purge pulse is in a range from about 0.1 Torr to about 1.0 Torr.

9. The method according to claim 1, wherein at least one of the first precursor pulse and the second precursor pulse lasts from 1 seconds to 5 minutes.

10. The method according to claim 6, wherein the precursor gas of the material comprises a transition metal.

11. The method according to claim 10, wherein the precursor gas of the material comprises a vapor of a transition metal chloride.

12. The method according to claim 10, wherein the precursor gas of the material comprises a vapor of $HfCl_4$, $TaCl_5$, $TiCl_4$, $MoCl_5$, $MoO_2Cl_2$, or $VCl_4$.

13. The method according to claim 6, wherein the precursor gas of the material comprises a Group III element or a Group IV element.

14. The method according to claim 13, wherein the precursor gas of the material comprises $Al(CH_3)_3$ or $AlCl_3$.

15. The method according to claim 13, wherein the precursor gas of the material comprises a Si-containing gas.

16. The method according to claim 15, wherein the Si-containing gas is a silicon halide.

17. The method according to claim 16, wherein the precursor gas of the material comprises octa-chloro-tri-silane hexa-chloro-di-silane or silicon tetrachloride.

18. The method according to claim 1, wherein the atomic layer deposition is performed at a temperature of less than 700 °C.

19. The method according to claim 1, wherein the method further comprises, after performing the plurality of deposition cycles, performing at least one of an in-situ and an ex-situ thermal treatment process, the thermal treatment process being performed under an ambient comprising at least one of $O_3$, $O_2$, $H_2O$ and $N_2$.

20. The method according to claim 18, wherein the atomic layer deposition is performed at a temperature in a range of 200 °C to 450 °C and wherein a precursor gas of the material comprises $Al(CH_3)_3$.

21. The method according to claim 19, wherein the thermal treatment process is performed, in-situ, at a temperature in a range of 450 °C to 1000 °C and at process chamber pressure in a range of 0.1 Torr to 10 Torr for a duration in a range of 15 minutes to 5 hours.

22. The method according to claim 19, wherein the thermal treatment process is performed ex-situ at a temperature of about 1000 °C for a duration in a range of 1 minute to 5 minutes.

23. The method according to claim 19, wherein the method further comprises repeating the performing of the plurality of deposition cycles and the performing of the at least one of the in-situ and the ex-situ thermal treatment process.

24. The method according to claim 1, wherein the one or more substrates are a plurality of substrates arranged in a substrate carrier extending in a longitudinal direction, the substrate carrier being receivable in the process chamber.

* * * * *